United States Patent [19]

Sameshima et al.

[11] Patent Number: 5,446,304
[45] Date of Patent: Aug. 29, 1995

[54] INSULATED-GATE-TYPE FIELD EFFECT TRANSISTOR WHICH HAS SUBGATES THAT HAVE DIFFERENT SPACING FROM THE SUBSTRATE THAN THE MAIN GATE

[75] Inventors: Toshiyuki Sameshima; Naoki Sano; Dharam P. Gosain; Setsuo Usui, all of Kanagawa, Japan

[73] Assignee: Sony Corporation, Tokyo, Japan

[21] Appl. No.: 314,929

[22] Filed: Sep. 29, 1994

Related U.S. Application Data

[63] Continuation of Ser. No. 951,758, Sep. 28, 1992, abandoned.

[30] Foreign Application Priority Data

Sep. 30, 1991 [JP] Japan .................... 3-278716

[51] Int. Cl.⁶ .............. H01L 29/76; H01L 29/04; H01L 27/01
[52] U.S. Cl. ..................... 257/365; 257/66; 257/347
[58] Field of Search ......... 257/57, 59, 66, 72, 257/347, 348, 350, 351, 365, 366, 383, 384, 352, 353

[56] References Cited

U.S. PATENT DOCUMENTS

4,319,263  3/1982  Rao ..................... 257/365
5,124,769  6/1992  Tanaka et al. .......... 257/366

FOREIGN PATENT DOCUMENTS

0197531  10/1986  European Pat. Off. ...... 257/383
1505959  12/1967  France ................. 257/366
60-226180 11/1985  Japan ................... 257/384
60-233859 11/1985  Japan ................... 257/365

OTHER PUBLICATIONS

Proceedings of the IEEE, Aug. 1968, "SB-IGFET: An insulated-gate field effect transistor using schottky barrier contacts for source and drain", Lepselter et al., pp. 1400-1402.

*Primary Examiner*—Steven H. Loke
*Attorney, Agent, or Firm*—Hill, Steadman & Simpson

[57] ABSTRACT

An active layer of an insulated-gate type field effect transistor is formed by a thin film of an intrinsic polycrystalline semiconductor and a source electrode and a drain electrode are formed on the active layer. A source region and a drain region are not formed in the active layer. A main gate electrode is formed on a gate insulating film of a portion between the source electrode and the drain electrode. Subgate electrodes are formed on the gate insulating film in a portion between the source electrode and the main gate electrode and a portion between the drain electrode and the main gate electrode, respectively.

1 Claim, 4 Drawing Sheets

INSULATED-GATE-TYPE FIELD EFFECT TRANSISTOR WHICH HAS SUBGATES THAT HAVE DIFFERENT SPACING FROM THE SUBSTRATE THAN THE MAIN GATE

This a continuation of application Ser. No. 07/751,758, filed Sep. 28, 1992, abandoned.

BACKGROUND OF THE INVENTION

1. Field of the Invention

The present invention relates to an insulated-gate type field effect transistor.

1. Description of the Prior Art

In the insulated-gate type field effect transistors such as MOS transistor using a bulk semiconductor and thin film transistor (TFT) using a thin semiconductor film, it is necessary to form a source region and a drain region comprising impurity diffused layers.

Therefore, in the conventional manufacture of the insulated-gate type field effect transistors, an impurity doping process to form the source region and drain region is inevitable. Particularly, in case of a CMOS transistor, a doping process of n-type impurities to form a source region and a drain region of an n-channel MOS transistor is necessary. A doping process of p-type impurities to form a source region and a drain region of a p-channel MOS transistor is also necessary. The manufacturing processes, consequently, are complicated.

OBJECTS AND SUMMARY OF THE INVENTION

It is an object of the invention to provide an insulated-gate type field effect transistor which can be easily manufactured because a source region and a drain region are unnecessary.

According to the invention, there is provided an insulated-gate type field effect transistor comprising: an active layer made of an intrinsic semiconductor or a semiconductor of a low impurity concentration; a source electrode and a drain electrode formed on the active layer; a main gate electrode formed between the source electrode and the drain electrode through a gate insulating film so as to face the active layer; and subgate electrode formed at least between the drain electrode and the main gate electrode through the gate insulating film so as to face the active layer.

According to the invention, in the case of forming main gate electrode and the source electrode in a manner such that they are mutually overlapped or their end portions substantially coincide with each other, there is no need to form the subgate electrode between the source electrode and the main gate electrode through the gate insulating film so as to face the active layer. In the cases other than above case, the subgate electrode is also formed between the source electrode and the main gate electrode through the gate insulating film so as to face the active layer.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention will be described hereinbelow with reference to the drawings.

Figure 1:
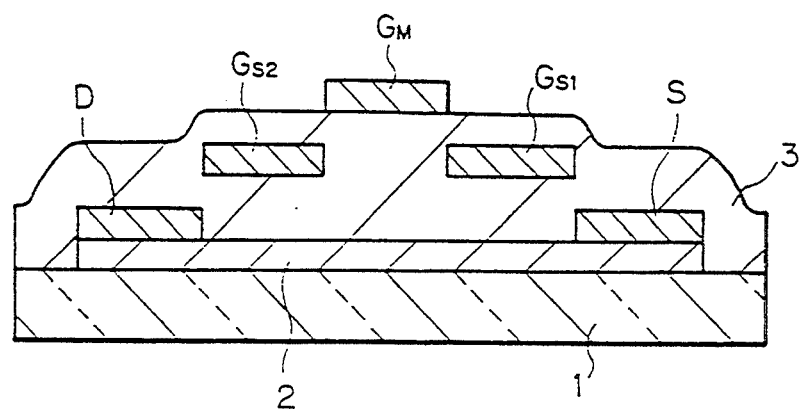
FIG. 1 is a cross sectional view showing a polycrystalline Si TFT according to the first embodiment of the present invention.

FIG. 1 shows a polycrystalline Si TFT according to the first embodiment of the invention.

As shown in FIG. 1, in the polycrystalline Si TFT according to the first embodiment, for example, an intrinsic polycrystalline Si thin film 2 constructing an active layer is formed on a glass substrate 1. A thickness of the polycrystalline Si thin film 2 is set to, for example, 20 nm. A source electrode S and a drain electrode D are formed on both edge portions of the polycrystalline Si thin film 2. In this case, a source region and a drain region are not formed in the polycrystalline Si thin film 2. Those source electrode S and drain electrode D are formed by a conductive material such as an aluminum (Al) film having thickness of, for example, 50 nm.

A main gate electrode $G_M$ is formed between the source electrode S and the drain electrode D through a gate insulating film 3 so as to face the polycrystalline Si thin film 2. The main gate electrode $G_M$ is formed by a conductive material such as an Al film having a thickness of, for example, 50 nm. Further, a subgate electrode Gs1 is formed between the source electrode S and the main gate electrode $G_M$ through the gate insulating film 3 so as to face the polycrystalline Si thin film 2. A subgate electrode Gs2 is also formed between the drain electrode D and the main gate electrode $G_M$ through the gate insulating film 3 so as to face the polycrystalline Si thin film 2. Those subgate electrodes Gs1 and Gs2 are formed by a conductive material such as an Al film having a thickness of, for example, 50 nm. The gate insulating film 3 is formed by, for example, a silicon dioxide ($SiO_2$) film or a silicon nitride ($Si_3N_4$) film.

In this instance, a thickness of the gate insulating film 3 of a portion between the subgate electrodes Gs1 and Gs2 and the polycrystalline Si thin film 2 is smaller than a thickness of the gate insulating film 3 of a portion between the main gate electrode $G_M$ and the polycrystalline Si thin film 2. Practically speaking, the thickness of the gate insulating film 3 of the portion between the subgate electrodes Gs1 and Gs2 and the polycrystalline Si thin film 2 is set to, for example, 120 nm and the thickness of the gate insulating film 3 of the portion between the main gate electrode $G_M$ and the polycrystalline Si thin film 2 is set to, for example, 240 nm.

An example of a manufacturing method of the polycrystalline Si TFT according to the first embodiment constructed as mentioned above will now be described.

Figure 2A:
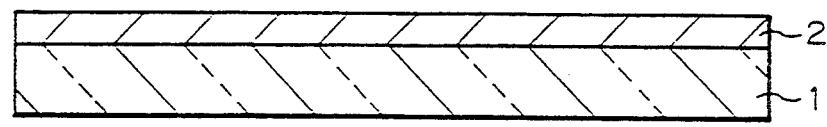
FIGS. 2A, 2B, and 2C are cross sectional views to explain a manufacturing method of the polycrystalline Si TFT according to the first embodiment of the invention in accordance with the order of processes.

That is, as shown in FIG. 2A, the polycrystalline Si thin film 2 is first formed on the glass substrate 1. Practically speaking, an amorphous Si thin film having a thickness of, for example, 20 nm is formed by, for example, a plasma CVD method and, after that, a laser beam in a wavelength range, for example, from ultraviolet rays to blue rays is irradiated to the amorphous Si thin film, thereby melting the amorphous Si thin film. After that, the melted film is solidified and crystallized, thereby forming the polycrystalline Si thin film. As a laser beam, for example, a pulse laser beam by various kinds of excimer lasers including a pulse laser beam (wavelength of 308 nm) by an XeCl excimer laser can be used.

Figure 2B:
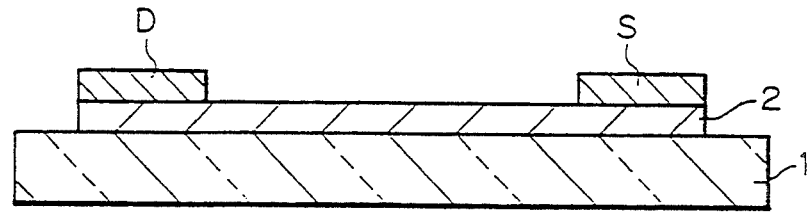

As shown in FIG. 2B, the polycrystalline Si thin film 2 is patterned into the shape of the active layer by etching. A channel doping for adjusting a threshold voltage is executed as necessary to the polycrystalline Si thin film 2 formed in an island shape by the patterning. After an Al film having a thickness of, for example, 50 nm was formed on the whole surface by, for example, a sputtering method, the Al film is patterned by etching, thereby forming the surface electrode S and drain electrode D.

Figure 2C:
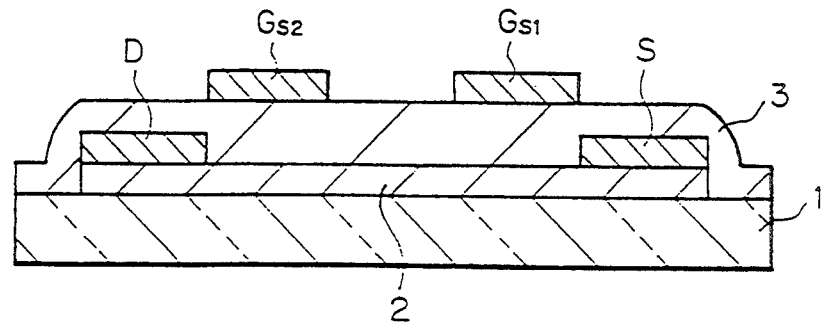

As shown in FIG. 2C, the gate insulating film 3 such as an $SiO_2$ film having a thickness of, for example, 120 nm is formed on the whole surface by, for example, a plasma CVD method. After an Al film having a thickness of, for example, 50 nm was formed on the whole surface by, for example, a sputtering method, the Al film is patterned by etching, thereby forming the subgate electrodes Gs1 and Gs2.

The gate insulating film 3 such as an $SiO_2$ film having a thickness of, for example, 120 nm is again formed on the whole surface by, for example, a plasma CVD method. After the Al film having a thickness of, for example, 50 nm was formed on the whole surface by, for example, a sputtering method, the Al film is patterned by etching, thereby forming the main gate electrode $G_M$.

A desired polycrystalline Si TFT shown in FIG. 1 is completed by the above processes.

Figure 3:
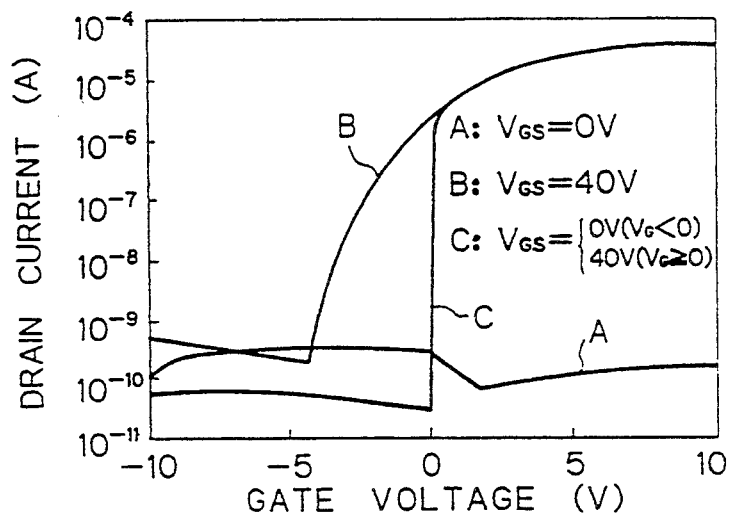
FIG. 3 is a graph showing the result of the measurement of drain current to gate voltage characteristics of the polycrystalline Si TFT according to the first embodiment of the invention.

FIG. 3 shows the results of the measurement of drain current-gate voltage characteristics when a drain voltage is set to 5 V and a gate voltage $V_{GM}$ which is applied to the main gate electrode $G_M$ is changed from $-10$ V to $+10$ V in the polycrystalline Si TFT according to the first embodiment in the case where those characteristics are measured by changing a gate voltage $V_{GS}$ which is applied to the subgate electrodes Gs1 and Gs2.

As shown in FIG. 3, it will be understood that in the case where the gate voltage $V_{GS}$ which is applied to the subgate electrodes Gs1 and Gs2 is equal to 0 V, even if a positive gate voltage $V_{GM}$ is applied to the main gate electrode $G_M$, the drain current hardly flows. This is because inversion layers, namely, channels are not formed in the polycrystalline Si thin film 2 near the interface with the gate insulating film 3 of the portions of the subgate electrodes Gs1 and Gs2 and offset regions are formed between the main-gate electrode $G_M$ and the source electrode S and drain electrode D.

On the other hand, in the case where the gate voltage $V_{GS}$ which is applied to the subgate electrodes Gs1 and Gs2 is equal to $+40$ V, the drain current hardly flows until the gate voltage $V_{GM}$ which is applied to the main gate electrode $G_M$ is equal to about $-5$ V. When the gate voltage $V_{GM}$ is larger than about $-5$ V, however, the drain current suddenly increases and the drain current is equal to or larger than $2 \times 10^{-4}$ A for the gate voltage $V_{GM}$ of $+5$ V or more. It will be understood from the above description that in the case where the gate voltage $V_{GS}$ of $+40$ V is applied to the subgate electrodes Gs1 and Gs2, the polycrystalline Si TFT operates in a manner similar to an n-channel MOS transistor and the operating mode is a depletion mode in such a case.

Further, when the gate voltage $V_{GM}$ which is applied to the main gate electrode $G_M$ is negative, the gate voltage $V_{GS}$ which is applied to the subgate electrodes Gs1 and Gs2 is set to 0 V. When the gate voltage $V_{GM}$ which is applied to the main gate electrode $G_M$ is positive, the gate voltage $V_{GS}$ which is applied to the subgate electrodes Gs1 and Gs2 is set to $+40$ V. In such a case, when the gate voltage $V_{GM}$ which is applied to the main electrode $G_M$ is negative, the drain current hardly flows. When the gate voltage $V_{GM}$ which is applied to the main gate electrode $G_M$ is equal to or higher than 0 V, however, the drain current suddenly flows. In such a case, therefore, it will be understood that the operating mode is an enhancement mode and extreme good switching characteristics are shown. In Fig. 3, Curve A is for a $V_{GS}$ of zero (0) volts, Curve B is for a $V_{GS}$ of forty (40) volts, and Curve C is for $V_{GS}$ less than zero (0) such as a minus forty $(-40)$ volts.

Figure 4:
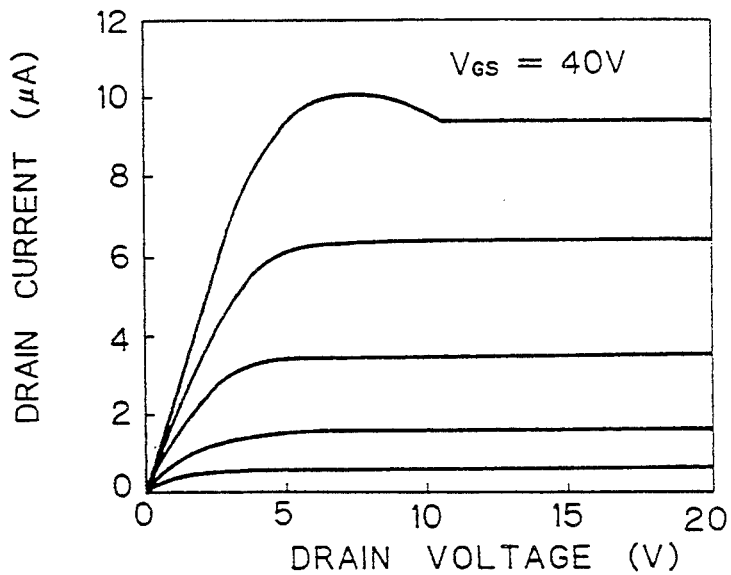
FIG. 4 is a graph showing the result of the measurement of drain current to drain voltage characteristics of the polycrystalline Si TFT according to the first embodiment of the invention.

FIG. 4 shows the results of the measurement of drain current-drain voltage characteristics when the gate voltage $V_{GS}$ which is applied to the subgate electrodes Gs1 and Gs2 in the polycrystalline Si TFT according to the first embodiment is set to $+40$ V in the case where such characteristics are measures by changing the gate voltage $V_{GM}$ which is applied to the main gate electrode $G_M$. As will be understood from FIG. 4, an increase of the drain current in association with an increase in the drain voltage is steep and this point shows that ohmic characteristics between the source electrode S and the subgate electrode Gs1 and between the drain electrode D and the subgate electrode Gs2 are good.

Figure 5:
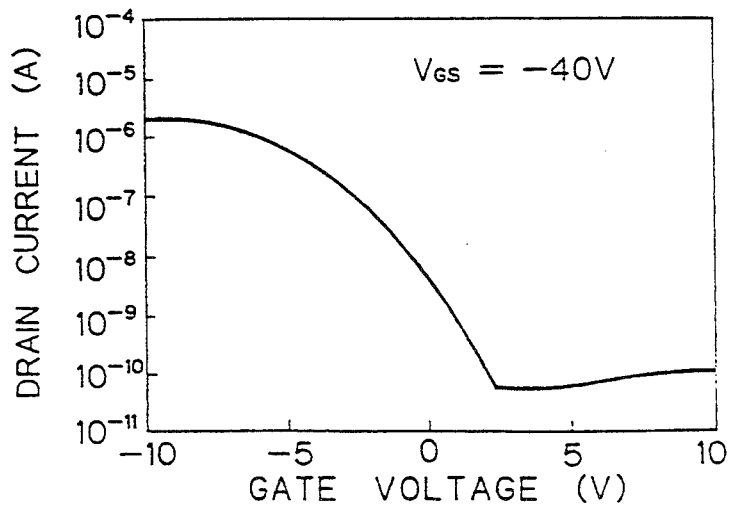
FIG. 5 is a graph showing the result of the measurement of drain current to gate voltage characteristics of the polycrystalline Si TFT according to the first embodiment of the invention.

FIG. 5 shows drain current-gate voltage characteristics when the gate voltage $V_{GS}$ of $-40$ V is applied to the subgate electrodes Gs1 and Gs2. It will be understood from FIG. 5 that when the gate voltage $V_{GS}$ of $-40$ V is applied to the subgate electrodes Gs1 and Gs2, characteristics similar to those of a p-channel MOS transistor are shown. This is because by applying the gate voltage $V_{GS}$ of $-40$ V to the subgate electrodes Gs1 and Gs2, holes are induced in the polycrystalline Si thin film 2 near the interfaces with the gate insulating film 3 in the portions of the subgate electrodes Gs1 and Gs2 and p-type inversion layers, namely, channels are formed.

As mentioned above, in the polycrystalline Si TFT according to the first embodiment, the subgate electrodes Gs1 and Gs2 are provided between the main gate electrode $G_M$ and the source electrode S and drain electrode D and by applying a desired gate voltage $V_{GS}$ to the subgate electrodes Gs1 and Gs2, the polycrystalline Si TFT can be used as an n-channel polycrystalline Si TFT or a p-channel polycrystalline Si TFT without forming the source region and drain region, and the operating mode can be set to the depletion mode or the enhancement mode in accordance with a method of applying the gate voltage $V_{GS}$. Since the source region and drain region are unnecessary, an impurity doping process to form those source region and drain region is unnecessary, so that the polycrystalline Si TFT can be easily manufactured.

The polycrystalline Si TFT generally has a problem such that a leakage current caused by the recombination of carriers at defects of the grain boundary in the polycrystalline Si thin film is large. In the polycrystalline Si TFT according to the first embodiment, however, by applying the gate voltage $V_{GS}$ which is equal to or lower than a threshold voltage to the subgate electrodes Gs1 and Gs2 in case of the n-channel polycrystalline Si TFT, and by applying the gate voltage $V_{GS}$ which is equal to or higher than the threshold voltage to the subgate electrodes Gs1 and Gs2 in case of a p-channel polycrystalline Si TFT, offset regions can be formed between the main gate electrode $G_M$ and the source electrode S and between the main gate electrode $G_M$ and the drain electrode D. Therefore, the leakage current between the source electrode S and the drain electrode D can be substantially reduced.

When the polarity of the gate voltage $V_{GM}$ which is applied to the main gate electrode $G_M$ and the polarity of the gate voltage $V_{GS}$ which is applied to the subgate electrodes Gs1 and Gs2 are set to the opposite polarities, and the inversion layer which is formed in the polycrystalline Si thin film 2 near the interface with the gate insulating film 3 of the portion of the main gate electrode $G_M$ and the inversion layers which are formed in the polycrystalline Si thin film 2 near the interfaces with the gate insulating film 3 of the portions of the subgate electrodes Gs1 and Gs2 become the opposite conductivity types. Therefore, a p-n junction is formed between those inversion layers, so that the leakage current between the source electrode S and the drain electrode D can be also reduced.

Figure 6:
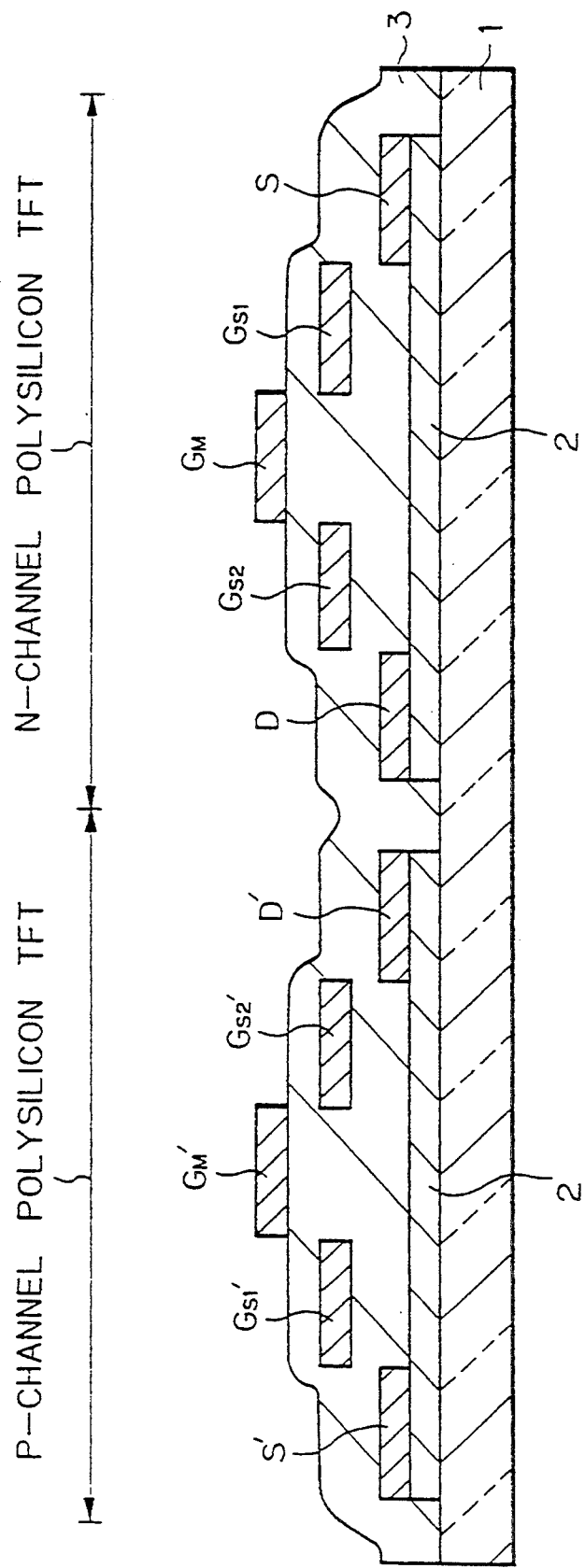
FIG. 6 is a cross sectional view showing a CMOS transistor according to the second embodiment of the invention.

FIG. 6 shows a CMOS transistor according to the second embodiment of the invention.

As shown in FIG. 6, the CMOS transistor according to the second-embodiment is constructed by: a polycrystalline Si TFT having the main gate electrode $G_M$ the subgate electrodes Gs1 and Gs2, the source electrode S, and the drain electrode D; and a polycrystalline Si TFT having a main gate electrode $G_M'$, subgate electrodes Gs1' and Gs2', a source electrode S' and a drain electrode D'. Each of the two polycrystalline Si TFT has a construction similar to that of the polycrystalline Si TFT according to the first embodiment.

In this instance, the polycrystalline Si TFT having the main gate electrode $G_M$, subgate electrode Gs1 and Gs2, source electrode S, and drain electrode D is used as an n-channel polycrystalline Si TFT and the polycrystalline Si TFT having the main gate electrode $G_M'$, subgate electrodes Gs1' and Gs2', source electrode S', and drain electrode D' is used as a p-channel polycrystalline Si TFT. Therefore, the gate voltage $V_{GS}$ is applied to the subgate electrodes Gs1 and Gs2 of the n-channel polycrystalline Si TFT in a manner such that an n-type inversion layer is formed on the surface of the polycrystalline Si thin film 2 constructing the active layer when the TFT is ON and the n-type inversion layer is not formed when the TFT is OFF. In a manner similar to the above, the gate voltage $V_{GS}$ is applied to the subgate electrodes Gs1' and Gs2' of the p-channel polycrystalline Si TFT in a manner such that a p-type inversion layer is formed on the surface of the polycrystalline Si thin film 2 constructing the active layer when the TFT is ON and the p-type inversion layer is not formed when the TFT is OFF.

In the CMOS transistor, the source electrode S of the n-channel polycrystalline Si TFT is connected to the ground and a power source voltage $V_{DD}$ is applied to the source electrode S' of the p-channel polycrystalline Si TFT. An output voltage $V_{OUT}$ is obtained from the drain electrode D of the n-channel polycrystalline Si TFT and the drain electrode D' of the p-channel polycrystalline Si TFT which are mutually electrically connected in accordance with the gate voltage $V_{GM}$ which is applied to the main gate electrode $G_M$ of the n-channel polycrystalline Si TFT and the main gate electrode $G_M'$ of the p-channel polycrystalline Si TFT which are mutually electrically connected.

According to the second embodiment, since the source region and drain region are unnecessary in both of the n-channel polycrystalline Si TFT and the p-channel polycrystalline Si TFT, both of the doping process of the n-type impurities to form the source region and drain region of the n-channel polycrystalline Si TFT and the doping process of the p-type impurities to form the source region and drain region of the p-channel polycrystalline Si TFT are also unnecessary, so that the manufacturing processes of the CMOS transistor can be simplified.

Figure 7:
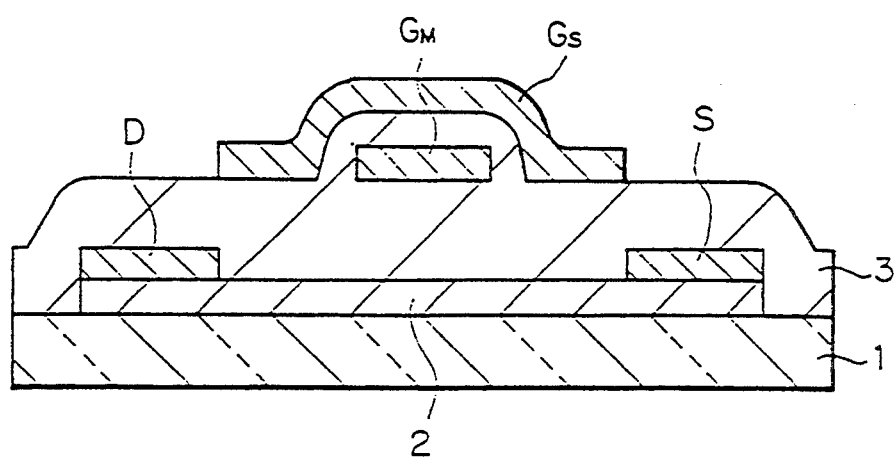
FIG. 7 is a cross sectional view showing a polycrystalline Si TFT according to the third embodiment of the invention.

FIG. 7 shows a polycrystalline Si TFT according to the third embodiment-of the invention.

As shown in FIG. 7, in the polycrystalline Si TFT according to the third embodiment, a subgate electrode Gs is formed between the source electrode S and the drain electrode D so as to stride over the main gate electrode $G_M$. The other constructions are similar to those of the polycrystalline Si TFT-according to the first embodiment.

In this case, since the gate insulating film 3 near the side wall portion of the main gate electrode $G_M$ is thicker than the other portions, the gate voltage $V_{GS}$ is applied to the subgate electrode Gs in a manner such that the inversion layer is also formed in the polycrystalline Si thin film 2 near the interface with the gate insulating film 3 of this portion.

An advantage similar to that of the first embodiment can be also obtained in the third embodiment.

Figure 8:
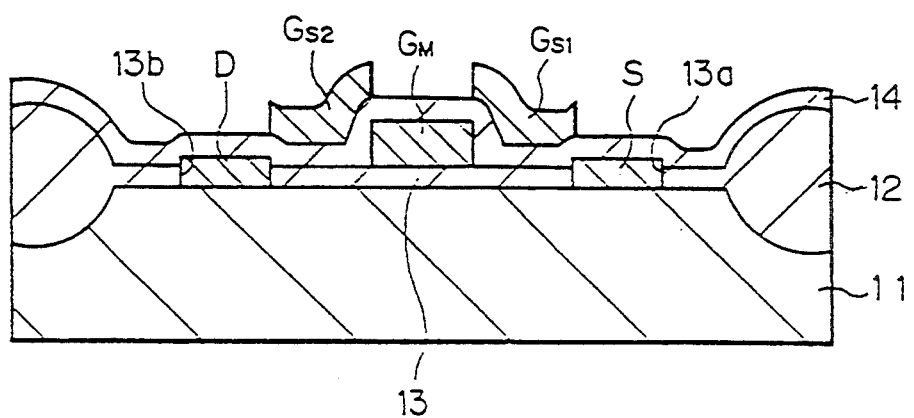
FIG. 8 is a cross sectional view showing an MOS transistor using bulk Si according to the fourth embodiment of the invention.

FIG. 8 shows an MOS transistor using bulk Si according to the fourth embodiment of the invention.

As shown in FIG. 8, in the MOS transistor according to the fourth embodiment, a field insulating film 12 such as an $SiO_2$ film is selectively formed on the surface of an Si substrate 11, thereby isolating the device. A gate insulating film 13 is formed on the surface of the active region surrounded by the field insulating film 12. The main gate electrode $G_M$ is formed on the gate insulating film 13. Further, the main gate electrode $G_M$ is covered by a gate insulating film 14.

Opening 13a and 13b are formed in predetermined portions of the gate insulating film 13 and the source electrode S and drain electrode D are formed on the Si substrate 11 through the openings 13a and 13b. The subgate electrode Gs1 is formed on the gate insulating film 14 in the portion between the main gate electrode $G_M$ and the source electrode S and the subgate electrode Gs2 is formed on the gate insulating film 14 in the portion between the main gate electrode $G_M$ and the drain electrode D.

According to the fourth embodiment, the source region and drain region can be made unnecessary in the MOS transistor using bulk Si and the manufacturing processes can be simplified.

Having described a specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the polycrystalline Si TFT according to each of the first to third embodiments mentioned above is of the staggered type (top gate type), the invention can be also applied to a polycrystalline Si TFT of the inverse staggered type (bottom gate type). The invention can be also similarly applied to an amorphous Si TFT.

According to the invention, a bandgap bending of the active layer near the interface with the gate insulating film in the portion between the drain electrode and the main gate electrode is caused by applying the gate voltage of the threshold voltage or more to the subgate electrode, and the n-type or p-type inversion layer, namely, the channel can be formed in the active layer near the interface with the gate insulating film of such a portion by the band bending in accordance with the polarity of the gate voltage which is applied to the subgate electrode. On the other hand, in the case where the gate voltage of the threshold voltage or lower is applied to the subgate electrode, no inversion layer is formed in the active layer near the interface with the gate insulating film, so that an offset region is formed between the drain electrode and the main gate electrode. With the above construction, the transistor operation can be performed even when the source region and drain region are not formed. Since the source region and drain region are unnecessary, the impurity doping processes to form those regions are unnecessary, so that the transistor can be easily manufactured.

What is claimed is:

1. An insulated-gate type field effect transistor comprising:
    an active layer made of a semiconductor of a low impurity concentration;
    a source electrode and a drain electrode formed on said active layer and each of said source electrode and said drain electrode made of a metal conducting film;
    a main gate electrode formed between said source electrode and said drain electrode on a gate insulating film so as to face said active layer;
    a first subgate electrode formed between said drain electrode and said main gate electrode in said gate insulating film and spaced closer to said active layer than said main gate electrode; and
    a second subgate electrode formed between said source electrode and said main gate electrode in said gate insulating film and spaced closer to said active layer than said main gate electrode and said first and second subgate electrodes symmetrically arranged relative to said main gate electrode, and the thickness of said gate insulating film between a first edge of said main gate electrode and a first edge of said first subgate electrode and the thickness of said gate insulating film between a second edge of said main gate electrode and a first edge of said second subgate electrode being thinner than the thickness of said gate insulating film between a second edge of said first subgate electrode and said active layer and the thickness of said gate insulating film between a second edge of second subgate electrode and said active layer, and a planar channel formed between said source electrode and said drain electrode.

* * * * *